United States Patent [19]
Mello et al.

[11] Patent Number: 5,910,878
[45] Date of Patent: Jun. 8, 1999

[54] METHOD AND APPARATUS FOR PROTECTING ELECTRICAL DEVICES FROM STATIC ELECTRICITY

[75] Inventors: Alfred A. Mello; Donald L. Pearl, both of Endicott, N.Y.

[73] Assignee: International Business Machines Corporation, Armonk, N.Y.

[21] Appl. No.: 08/883,488

[22] Filed: Jun. 26, 1997

[51] Int. Cl.$^6$ ........................................... H05F 1/00
[52] U.S. Cl. ................................. 361/212; 361/220
[58] Field of Search ........................ 206/709, 719–721; 361/212, 220

[56] References Cited

U.S. PATENT DOCUMENTS

| | | | |
|---|---|---|---|
| 3,653,498 | 4/1972 | Kisor | 361/212 |
| 4,316,231 | 2/1982 | Michel . | |
| 4,333,565 | 6/1982 | Woods . | |
| 4,553,190 | 11/1985 | Mueller . | |
| 4,565,288 | 1/1986 | Walther . | |
| 4,696,101 | 9/1987 | Vanzetti et al. . | |
| 4,711,350 | 12/1987 | Yen . | |
| 4,725,918 | 2/1988 | Bakker . | |
| 4,730,159 | 3/1988 | Collins . | |
| 4,790,433 | 12/1988 | Raszewsi | 206/719 |
| 4,799,854 | 1/1989 | Niskala . | |
| 4,870,354 | 9/1989 | Davaut . | |
| 4,927,692 | 5/1990 | Dhanakoti et al. . | |
| 4,943,242 | 7/1990 | Frankeny et al. . | |
| 5,012,924 | 5/1991 | Murphy . | |
| 5,023,544 | 6/1991 | Vallone et al. . | |
| 5,038,248 | 8/1991 | Meyer . | |
| 5,040,291 | 8/1991 | Janisiewicz et al. . | |
| 5,041,319 | 8/1991 | Becker et al. . | |
| 5,093,984 | 3/1992 | Lape . | |
| 5,110,669 | 5/1992 | Knobel et al. . | |
| 5,123,850 | 6/1992 | Elder et al. . | |
| 5,153,983 | 10/1992 | Oyama . | |
| 5,163,834 | 11/1992 | Chapin et al. . | |
| 5,164,880 | 11/1992 | Cronin . | |
| 5,225,037 | 7/1993 | Elder et al. . | |
| 5,232,091 | 8/1993 | Hennessy et al. . | |
| 5,290,134 | 3/1994 | Baba . | |
| 5,313,156 | 5/1994 | Klug et al. . | |
| 5,331,406 | 7/1994 | Fishbaine et al. . | |
| 5,377,405 | 1/1995 | Sakurai et al. . | |
| 5,397,245 | 3/1995 | Roebuck et al. . | |
| 5,436,567 | 7/1995 | Wexler et al. . | |
| 5,501,899 | 3/1996 | Larkin | 361/212 |

OTHER PUBLICATIONS

Modular Tube with Internal Slider; IBM Technical Disclosure Bulletin; vol. 36, No. 04, Apr. 1993.

*Primary Examiner*—Fritz Fleming
*Attorney, Agent, or Firm*—William N. Hogg

[57] ABSTRACT

Electrical devices such as leaded electronic components, i.e., components with extended input/output leads, are loaded in a magazine that protects them from electrostatic discharge. Each component is held in a component holder with a conductive shorting or discharge pad, comprising a bundle of conductive filaments within a conductive foraminous web that can be moved into contact with the leads to protect them from electrostatic discharge, and moved away from the leads to allow access for testing or processing. At a testing or processing station, the magazine is placed on a mating base and the devices are supported and positioned by supports on the magazine and base. Upon completion of a testing or processing sequence, the magazine can be separated from the base and moved to another testing or processing station, where the magazine is placed on another base.

21 Claims, 3 Drawing Sheets

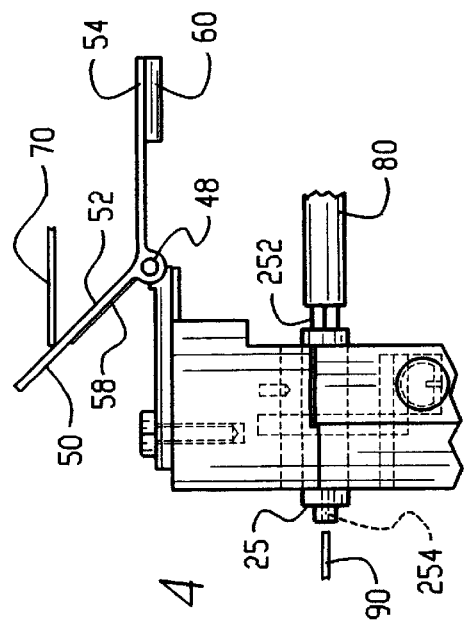
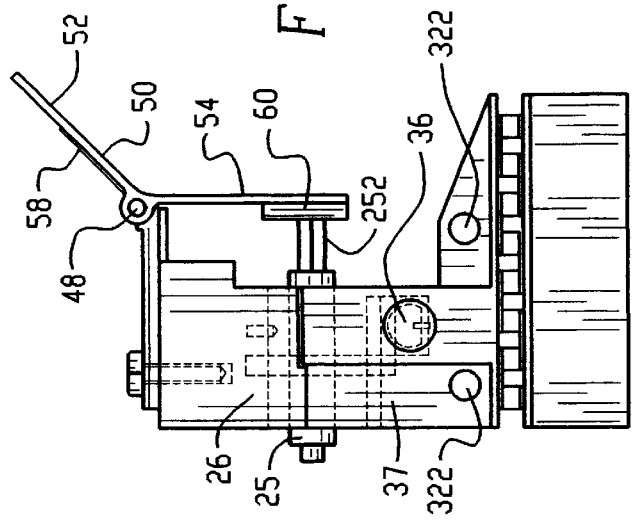
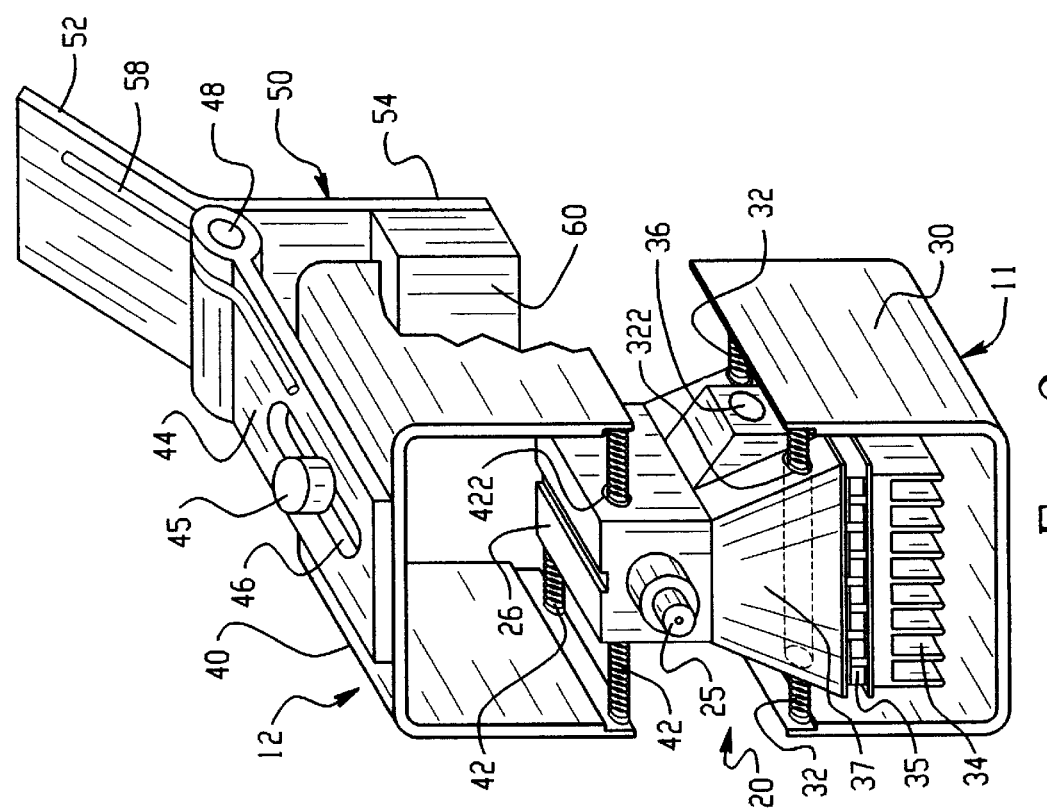

METHOD AND APPARATUS FOR PROTECTING ELECTRICAL DEVICES FROM STATIC ELECTRICITY

TECHNICAL FIELD

This invention relates to electrical components and systems, and more particularly to improved methods and apparatus for protecting electrical devices such as leaded electronic components, i.e. components with extended leads (usually in the form of thin metal wires) from electrostatic discharge.

BACKGROUND OF THE INVENTION

With the ever expanding use of increasingly sensitive electronic equipment, the demand for packaging and other materials that protect electronic components from electrostatic discharge has increased dramatically. Electrostatic discharge is generally recognized as one of the most destructive—perhaps THE most destructive—phenomenon confronting the electronics industry. Modern electronic components such as printed circuits and microchips can be damaged by overheating and/or dielectric breakdown from static discharge of as little as 50 volts, and static charges of 10,000 volts or more can be, and frequently are, generated through friction, motion, separation of dissimilar materials and induction in the handling, packaging and shipping of electronic components.

Two general types of protection are commonly employed. The devices may be shielded from electrostatic or radio frequency fields with conductive packaging, incorporating materials such as carbon black or carbon-loaded polymers, providing a "Faraday-cage" effect that bleeds static electricity to ground or causes it to circulate harmlessly until it decays to a level that will not damage the components. This method, however, does not protect the device when the device is removed from the container. Typically, when the device is in the container, not all the leads are in contact with the conductive packaging. Thus, some leads may not be at the same potential as others. Static electricity can build up on the device (through the unprotected leads) from operators, others in the vicinity of the containers or various other causes, and the device could be damaged as soon as the container is opened.

Alternative methods for protecting components from destructive electrostatic discharge include: shorting and/or grounding the leads so as to reduce the build-up of static; dissipating the static with a controlled discharge to ground; and maintaining a uniform electrostatic potential. In some cases, the leads are grounded to discharge the static. In others the leads are simply shorted together so that everything is at the same potential.

Traditional methods of grounding the leads of electrical devices have included: 1) twisting all the leads of the device together, 2) pushing all the leads into a pad of semi-rigid electrostatic discharge (or "ESD") foam material, 3) wrapping the leads in some form of conductive foil, 4) placing the leads into conductive liquid, 5) pushing the leads through a thin piece of conductive foil, and 6) plugging the leads into a specially designed conductive cap. Unfortunately, all of these approaches suffer from serious drawbacks.

With the first method the twisted leads have to be untwisted and then straightened, if possible. This approach adds several costly and time-consuming process steps. In addition, the leads can be weakened by fatigue.

The second method causes unwanted particle materials to be generated during the insertion and removal processes. It can also cause the device leads to be bent, again, causing fatigue and possible fracture. However, the main concern is that this approach cannot be used in clean room areas because of the risk of particulate contamination. Much of the work with electronic components must be done in clean room areas.

The third and fifth methods, wrapping the leads, or pushing the leads through a thin conductive sheet, can bend the leads. As mentioned above, bent leads add process steps, expense, and damage to the leads by fatigue or fracture. Pushing the leads through conductive sheets can also generate particulate contaminates.

Similarly, placing the leads in conductive liquid, the fourth method, is likely to contaminate the leads and require cleaning. Cleaning and inspection add unwanted and costly process steps.

The sixth method of placing the leads into a specially designed conductive cap is expensive. It also adds time, since it requires additional process steps to insert and remove the leads.

The following patents and corporate technical bulletin illustrate a variety of typical protective devices and methods: U.S. Pat. No. 5,232,091 to Hennessey et al, assigned to Eastman Kodak, Co.; U.S. Pat. No. 5,164,880 to Cronin, assigned to Polaroid Corp; U.S. Pat. No. 5,110,669 to Knobel et al, assigned to Dow Chemical Co; U.S. Pat. No. 5,041,319 to Becker et al, assigned to Conductive Containers, Inc; U.S. Pat. No. 5,038,248 to Meyer, assigned to Harris Corp; U.S. Pat. No. 4,553,190 to Mueller, assigned to Minnesota Mining and Manufacturing Co; U.S. Pat. No. 4,333,565 to Woods; and IBM Technical Disclosure Bulletin, Vol.36, No. Apr. 04, 1993.

Hennessey et al, Mueller et al and the IBM Technical Disclosure Bulletin disclose representative devices that shield (and ground at least some of) the leads within conductive containers. The Hennessey container has a conductive strip, inside the container, which is urged against the pins of components packaged in the container when the container is closed. Mueller et al discloses a container for longitudinally receiving components that are sensitive to electrostatic discharge, featuring a rigid longitudinal channel having a transparent conductive layer. The IBM Technical Disclosure Bulletin discloses a somewhat similar packaging device using a module tube constructed of conductive plastic.

Although these packaging containers protect the leads of the devices from unwanted electrical charges while the devices are within the containers or tubes, they do not protect the devices while they are being handled during the various testing or manufacturing process steps. Between each testing or manufacturing test station, the devices must be reloaded back into their protective containers or tubes. Then they must be unloaded again and inserted into the next tester station. At each loading and unloading stage, as well as in the test position within the testers themselves, the devices are exposed to possible damage from unwanted electrical charges.

Cronin, Knobel et al, Becker et al, Meyer, and Woods all disclose protective materials, methods and apparatus that rely primarily on the controlled shorting and/or discharge of static electricity. Cronin discloses an apparatus for protecting printed circuit (or "PC") boards with conductive pads along at least one edge for connecting the board with an edge connector. Cronin's system includes a dual-hinged structure that urges electrically conductive grounding bars against the conductive pads, shorting them together. When the board is inserted into an edge connector, the connector pushes on the hinged structures and moves the electrically conductive grounding bars away from the conductive pads. The pads are then free to engage the edge connector. This structure seems well-suited for the relatively robust contacts on the edge of PC boards, but much less adaptable to the fragile wire leads of other typical electronic devices such as microchips, which can be damaged by fatigue and fracture.

Knobel et al and Becker et al disclose two different prior art grounding materials. Knobel et al discloses a laminated plastic material useful in making shipping bags for protecting electronic devices from build up of static charges on their leads during transport and storage. Becker et al discloses a multilayered foam material for protecting leaded electronic devices from built-up electrostatic charges through lead insertion into a foam. Pushing the leads through either of these materials (if even possible for the Knobel shipping bag material) can bend the leads, adding unwanted process steps to straighten the leads, expense and fatigue damage to the leads.

Meyer discloses an electrostatic discharge protection device that includes shorting elements for shorting the leads together and an actuator, responsive to being inserted into a tester, to disengage the shorting elements from the leads. However, no means is provided for compensating for different lead lengths or diameters.

Woods discloses a package with an electrically conductive pad in which microcircuit devices may be embedded for storage, transportation and field use. The package, which has a top panel that covers the embedded components, is said to inhibit electrostatic charge buildup, but it would appear that the primary protective effect is through short-circuiting the leads of the components. In addition, the system only functions as a protective carrier for transporting the devices to the testing line. Once there, the devices are removed from their protective packages and left unprotected for the entire testing time.

To offer the maximum protection to the devices to be tested at the minimum test cycle time and cost, it is necessary to reduce the handling time of the devices to one loading/unloading cycle in the test fixtures and to protect the devices within the test fixtures before and after the actual tests on the devices.

SUMMARY OF THE INVENTION

This invention provides improved methods and apparatus for protecting electronic devices from static electricity by reducing build-up of static and by providing a controlled discharge of electricity. A shorting pad is constructed of a bundle of metal wires or other conductive filaments. A foraminous web, which may be a net of conductive string or other filaments or a conductive screen with openings sized and spaced to accommodate leads extending from electronic components, defines the outer surface of the bundle and provides a grounding path. The individual filaments have sufficient flexibility to maintain electrical contact with the extended leads without damaging the leads. The resistance or resistivity of the filaments is designed or selected to discharge static electricity from the leads without overheating, or causing other electrical damage to the components. Resistance values of the materials can vary from a low ohmic value, to provide an almost dead short, to any resistance range value depending on the material compositions and any special application requirements of the devices under test. Device current limitations, additional tester device load circuitry, and possible time constant discharge requirements are all factors that can impact the resistance design value requirements.

This shorting pad can be used safely in clean rooms because it does not introduce particles or other contamination. It is also very inexpensive because it can be made using scrap, or other existing ESD conductive material, with simple existing processes. The construction process can be the same as used to make plastic kitchen scrubbers. The only differences are the ESD materials and the desired sizes.

The pad is unique and advances the state of the art with respect to electrostatic protection. It is totally different from existing foam shorting materials, which require the use of force to puncture the foam conductive surfaces with the device leads. This can damage the leads and generate unwanted particle materials between the leads and within the clean room areas. The shorting pad of this invention dramatically reduces these problems. Less force is required to insert leads into the pad, which reduces both damage to the leads and particulate contamination.

The improved shorting pad is easily sized or otherwise modified to meet the requirements of a wide variety of devices, systems, processes and applications. A wide variety of modifications that may be made to adapt to particular needs will be readily apparent to those skilled in the art.

In the preferred embodiment of this invention, a shorting conductor such as the pad described above, is mounted on a shorting flapper, which is pivoted to move the conductor away from the device leads for loading, unloading and electrical and/or other testing of the device.

This shorting flapper protects components from ESD damage before testing, during the testing process (but not during the actual testing of the device) and while the components are transferred to and from the testing stations. Typically, the devices under test (or "DUT") are first loaded into a ten unit (or ten position) magazine which has a shorting flapper at each position. The DUT are always protected by the normal default position of the flappers. When the magazines are loaded into a testing apparatus, the devices are still protected by the flappers. They remain protected until the actual testing sequence begins, at which time the flappers are automatically moved away from the leads to allow power supplies, instruments and the like to be connected to the devices. Upon completion of the test, the flappers automatically move back to the default position, once again protecting the device. The flappers remain in their default positions while the magazine is removed from the tester and moved to another tester or process step, and continue to protect the devices during the handling process.

The ESD shorting flapper is totally automatic and does not require any operator intervention for normal parts handling. Once the devices are loaded into the ten position magazine with the spacing position set for the proper lead lengths, no further activity is required by the operator with regard to the ESD protection of the devices.

This pad and flapper are unique, and advance the state of the art with respect to ESD protection. They are totally different in the concept of applying ESD shorting pad protection to the leads of devices under test, regardless of the length of the leads involved. They are believed to be the only ESD shorting system that offers ESD protection to very short or even cut off lead stubs, while still being capable of handling longer leaded devices. They also protect short lead devices during handling, before, during and after tests, and through transit times. No known type of shorting pad system exists that supplies ESD protection to the short stub leads of devices during the total testing and handling cycle.

Other advantages, benefits and objectives of this invention will be apparent from the following detailed description.

DRAWINGS

FIG. 2 is an enlarged perspective view of one of the device or component holders in the assembly shown in FIG. 1.

FIG. 3 is a side elevation view of the component holder in FIG. 2, showing an electrostatic shorting pad of this invention engaging the leads of an electronic component.

FIG. 4 is a partially broken away view of the component holder in FIG. 3, with a shorting flapper in accordance with this invention pivoted to allow access to the leads of the electronic device for tests.

Figure 6A:
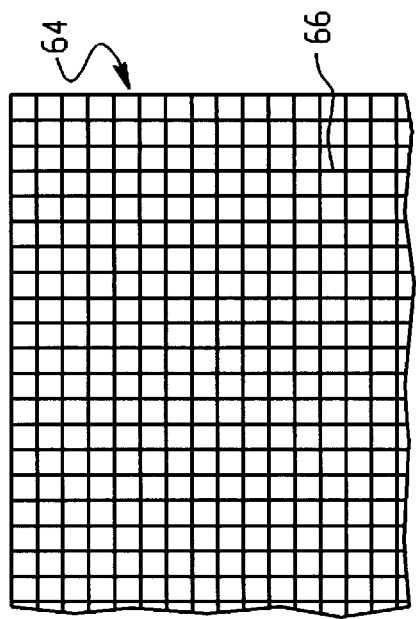
Figure 6B:
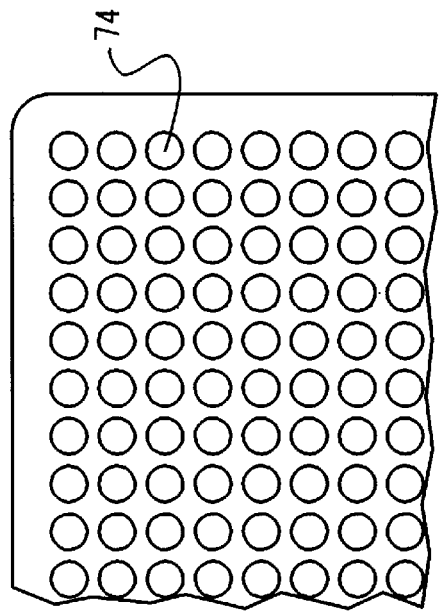

FIGS. 6A and 6B illustrated two foraminous webs that may be used to maintain the individual conductive filaments of the shorting conductor in FIG. 4 in a coherent and defined bundle.

DETAILED DESCRIPTION

Figure 1:
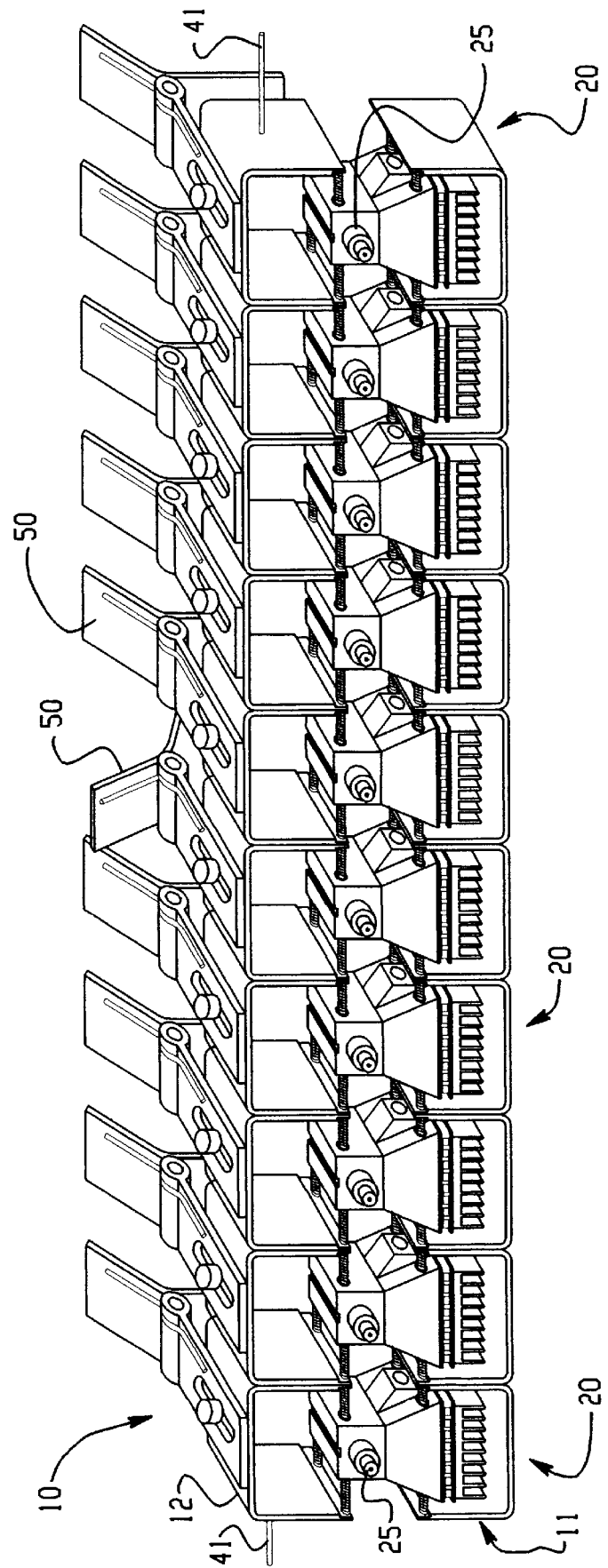
FIG. 1 is a perspective view of a magazine and base assembly embodying this invention.

FIG. 1 illustrates a magazine and base assembly 11 for an optical sub-assembly testing system (not shown). It is also suitable for or easily adapted to a wide variety of other testing, processing, and assembly system.

Assembly 10 comprises a magazine 12 and a mating base 11 that combine to form ten individual component holders 20, each of which supports an optical/electrical component 25 going through the test procedure. Components 25 are conventionally referred to as "devices under test" or "DUT", although in most systems only one "DUT" is being tested at any given time.

Base 11 is mounted on a conventional feed system (not shown) that feeds the magazine and base assembly 11 through the testing apparatus intermittently, so that the DUT 25 are brought to the testing station sequentially. In FIG. 1, the fifth component holder 20 from the left end of the magazine 12 is shown with its shorting flapper 50 in position to allow access to the leads of the DUT mounted in this holder for testing or similar operations. As shown in FIG. 3, shorting flappers 50 on the remaining test fixtures 20 are positioned to contact the leads 252 of the DUT 25. Thus, the DUT 25 are protected from electrostatic discharge both before and after testing.

As shown in FIG. 2, each of the component holders 20 comprises a lower shell 30, which is part of base 11, and an upper shell 40, which is part of magazine 12. The lower shell 30 includes a lower thermal block 37, which supports the DUT and permits heating and cooling of the DUT 25 during testing. A heat sink 34 is attached to one side of a thermoelectric element 35 while the other side is attached to the lower thermal block 37. A thermistor slot 36 in thermal block 37 allows a thermistor to be placed in direct contact with the DUT 25. The thermistor and thermoelectric cabling element (not shown) are wired into the tester system. The thermistor, the thermoelectric element, additional tester circuitry and software are used to control the heating and cooling cycling of the DUT.

Referring now to FIGS. 2–4, the lower thermal block 37 is connected to the lower shell 30 with two compliance springs 32 which extend through holes 322 within the lower thermal block 37. An upper thermal block 26 is supported in upper shell 40 by two compliance springs 42 running through holes 422 in the upper thermal block 26. DUT 25 is attached to the bottom of upper thermal block 26 with a suitable fastener such as a clip spring (not shown).

The magazine 12 is loaded by attaching a DUT to the upper thermal block 26 of each component holder 20. The magazine 12, with ten upper shells 40 carrying ten components, is then positioned above the bottom support section 11, with ten lower shells 30 and ten lower thermal blocks 37. Each DUT contacts one of the lower thermal blocks 37 and is held in place by the upper thermal block and lower thermal block. The compliance springs 42, 32 that support upper thermal block 26 and lower thermal block 37 allow DUT 25 to move slightly to facilitate connection of probes and instruments, such as the fiber optic cable illustrated in FIG. 4, to the DUT.

The upper shells are connected together to form magazine 12, in which a number of DUT can be moved safely from one test or processing system to another, with all of the DUT protected from electrostatic discharge. In the illustrated assembly, handles 41 are attached to the upper shells 40 at each end of the magazine 12 to facilitate movement of the magazine to the next test or processing station, where the magazine 12 is placed on another base (not shown). Typically, this base moves the magazine through the next test or process, with the components still protected from electrostatic discharge except when they are actually being tested or processed.

As best seen in FIGS. 2–4, shorting flappers 50 are mounted on each of the upper shells 40. A slotted plate 44 is attached to the upper shell 40 with a mounting bolt 45 which extends through the slot 46 in the plate 44. This allows the position of the shorting flapper 50 to be adjusted to compensate for changes in the length of the leads 252 of the DUT 25 at the individual component holder.

The shorting flappers 50 are supported by and pivot around pivot rods 48 at the rear end of the mounting plates 44. Each shorting flapper 50 consists of a metal lever arm bent with an approximately 135 degree angle at a pivot rod 48. The upper lever arm section 52 above pivot rod 48 is the activation arm while the lower lever arm section 54 below the pivot rod 48 is the shorting arm. Attached to the shorting arm 54 is a conductive shorting or discharge pad 60 that is positioned to contact the leads 252 of the DUT 25 in that compliance test fixture 20. In the normal default position as shown in FIG. 3, the shorting pad 60 on arm 54 makes electrical contact with all the leads 252 of the DUT 25. Contact pressure between the leads 252 and the shorting pad 60 is supplied by gravity acting on shorting flapper 50 and by the spring tension of a wire hair pin spring 58 located at the pivot rod 48. With one end of the wire hair pin spring 58 fixed by design to the slotted plate 44, the other end of the wire hair spring 58 applies a downward pressure to the top surface of the lever arm 52. The resulting action is to force the shorting pad 60 to make contact with the device leads 252. When one of the compliance test fixtures 20 reaches the test station, a punch rod 70 extends forward from an electrical solenoid, pneumatic cylinder or other actuator (not shown) and moves the flapper's actuator arm 52 forward, compressing the wire hair pin spring 58 and moving the shorting arm 54 section of the lever arm away from the device leads 252 as shown in FIG. 4. This makes the DUT leads 252 available to an electrical probe head 80, which supplies power to the DUT 25 and connects it to test instruments or the like.

In the illustrated apparatus, another type of connection is made at the opposite end of the DUT 25 at the test station. As shown in FIG. 4, a fiber optic cable 90, rigid optic fiber rod, sphere insert or other test instrument is inserted into an optical test port 254 at the front of the DUT 25 for test purposes.

When the test is completed, the electrical probe 80 and fiber optic cable 90 or other front end unit are retracted. The punch rod 70 is then deactivated, allowing the shorting flapper 50 to return to the default position shown in FIG. 3. In the default position, shorting pad 60 once again protects the leads 252 of the DUT 25.

Figure 5:
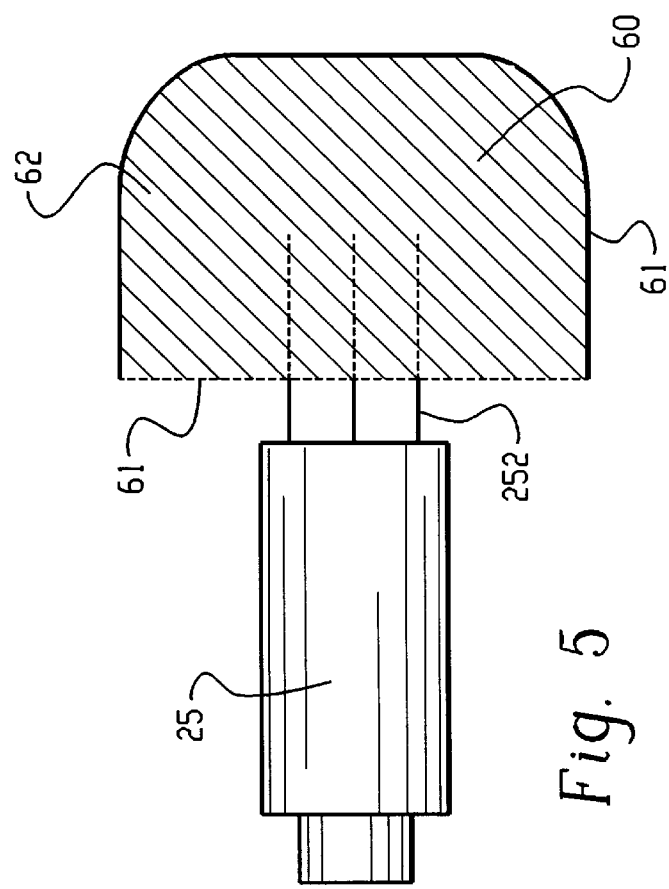
FIG. 5 is an enlarged cross-sectional view of the preferred shorting conductor on the shorting flappers, shown in FIG. 2, at the individual testing positions of the testing apparatus shown in FIG. 1.

The preferred shorting pad 60 for the illustrated shorting flapper 50 is shown in FIGS. 5, 6A and 6B. The basic shorting pad 60 consists of two elements. The outer surface of shorting pad 60 is a foraminous web 61, such as the net 64 of conductive filaments 66 shown in FIG. 6A or the perforated screen 74 shown in FIG. 6B, that allows the leads 252 to reach the interior of the pad. The interior of shorting pad 60 contains either more conductive net material or loosely grouped bundles of thin diameter conductive string/thread/cord or equivalent filaments 62. Combinations of the various materials also could be used. When thin conductive thread is rolled or grouped into a loose bundle of thread like a fuzz ball and placed within an outer conductive net or web 61, a very soft shorting pad 60 is formed. Leads 252 from the DUT 25 to be protected easily slip through the large number of holes in the outer web 61 and gently slide past the numerous contact points of the conductive fuzz ball contained within web 61. Since the outer web 61 and the inner filaments 62 are in contact with each other and each is conductive, any conductive lead in contact with them is also at the same potential level. Therefore, when all the leads 252 of a DUT 25 are placed into the shorting pad 60, they are set to the same potential level. The device is now protected from ESD.

Typically, web 61 consists of a conductive material with apertures at least 0.025 inches in diameter and webbing less than 0.010 inches in width. The exact dimensions are not critical and may be changed to suit individual components. The pad can be sized as needed to accommodate a range of device lead configurations. The only limiting factor on size is the clearance distance required between the bottom of shorting flapper 50 and the probe head 80 as the shorting flapper 50 is moved out of the way of the probe head 80. As noted above, the resistance of the filaments in shorting pad 60 may be varied to suit a wide range of components, depending on the requirement of the devices under test. In some cases materials with a low ohmic value to provide almost a dead short may be acceptable or desirable. In others, the resistance may need to be somewhat higher to avoid damaging discharges. Values of 1 to 10 megohms are expected to be suitable for most applications.

Since no holes are punched into the shorting pad 60 by the lead insertion process, no unwanted particles are generated that can cause problems within the clean room areas. When the leads 252 are inserted into the shorting pads 60, the loosely packed bundles give way to any direct force applied to them. The result is that no unwanted particles are generated from the insertion process.

The shorting pads have been built from ESD storage bags (produced by Minnesota Mining & Manufacturing Company) and used to protect laser diode and PIN devices before, during, and after testing. The conductive bags were cut into thin string segments, curled up, and placed into a outer cover net made of the same material. With a large supply of holes in the net, no lead bending was encountered. This proved that the lead bending problem could be solved with this method.

As may be seen from the foregoing description, the improved shorting pads and apparatus of this invention provide economic, effective and flexible tools for protecting electronic devices from damaging electrostatic discharge in a wide range of systems and applications. As those skilled in the art will recognize, many modifications may be made to the embodiments shown herein within the scope of this invention, which is defined by the following claims.

We claim:

1. Apparatus for protecting electrical devices with extended leads from damaging electrostatic discharge comprising at least one shorting conductor comprising a bundle of conductive filaments and a foraminous web defining an outer surface of said bundle.

2. Apparatus according to claim 1 wherein said foraminous web comprises a net of conductive filaments.

3. Apparatus according to claim 1 wherein said foraminous web comprises a perforated screen made of a conductive material.

4. Apparatus according to claim 1, further comprising a movable support adapted to:

a) move said shorting conductor into contact with substantially all of the leads of one of said devices for controlled discharge of static electricity from said leads; and b) move said shorting conductor away from said leads to allow access to said leads or movement of said electrical device.

5. Apparatus according to claim 4 wherein said movable support comprises a pivoting flapper, said shorting conductor being mounted on said flapper.

6. Apparatus according to claim 5 further comprising an actuator for moving said flapper.

7. An electrostatic shorting pad for controlled discharge of static electricity from electronic components with exposed leads, comprising:

(a) a bundle of conductive filaments electrically interconnected to provide a substantially constant grounding potential, said filaments having sufficient flexibility to maintain electrical contact with said leads without damaging said leads and resistivity adapted to discharge static electricity from said leads without damaging said components; and (b) a foraminous web defining an outer surface of said bundle.

8. Apparatus according to claim 7 wherein said foraminous web comprises a net of conductive filaments.

9. Apparatus according to claim 7 wherein said foraminous web comprises a perforated screen made of a conductive material.

10. A magazine for feeding electronic components with exposed leads which are sensitive to electrostatic discharge, comprising:

(a) two or more component holders, each of said holders being adapted to support one of said electronic components and having a flexible shorting conductor with a substantially constant grounding potential; and (b) means for moving said shorting conductors into contact with said exposed leads to protect said electronic components from damaging electrostatic discharge, and for moving said shorting conductors away from said leads so that said electronic components can be fed from said magazine.

11. A magazine according to claim 10 wherein said means for moving said shorting conductor into contact with and away from said leads comprises a pivoting flapper, said shorting conductor being mounted on said flapper.

12. A magazine according to claim 11 having a plurality of stations for mounting said electronic components, and having one of said shorting conductors mounted on each of said flappers at each of said stations.

13. Apparatus for feeding electrical devices with exposed leads that are sensitive to electrostatic discharge comprising:
   (a) a base comprising two or more base supports adapted to contact and position said devices;
   (b) a magazine comprising two or more magazine supports, each of said magazine supports being adapted to support one of said electronic components and having a flexible shorting conductor with a substantially constant grounding potential, and means for moving said shorting conductors into contact with said exposed leads to protect said electrical devices from damaging electrostatic discharge and for moving said shorting conductors away from said leads, said magazine being:
      (i) designed and adapted to be placed adjacent to said base so that said magazine supports are aligned with said base supports, whereby each of said devices is positioned between and supported by one of said magazine supports and one of said base supports; and
      (ii) designed and adapted for removal from said base, with said devices attached to said magazine supports, to move said devices to a different testing or processing station.

14. Apparatus according to claim 13 wherein said base is attached to a testing of process station and adapted for intermittent motion to bring said electrical devices to a testing or processing station sequentially.

15. Apparatus according to claim 13 wherein said base supports and said magazine supports are mounted on springs that permit a device positioned between one of said base supports and one of said magazine supports to move to facilitate connections to said device.

16. Apparatus according claim 13 wherein said base support and said magazine support comprise thermal blocks.

17. Apparatus according to claim 16, further comprising apparatus for heating or cooling said device connected to at least one of said thermal blocks.

18. Apparatus according to claim 16 wherein a temperature sensor is connected to at least one of said thermal blocks.

19. A method of testing electrical component having exposed leads that are sensitive to electrostatic discharge, comprising the steps of:
   (a) loading said electrical component into a magazine having a shorting conductor mounted on a pivoting flapper biased to maintain said shorting conductor in contact with substantially all of said leads;
   (b) pivoting said flapper to move said shorting conductor away from said leads to make said leads accessible for testing;
   (c) connecting said leads to at least one testing instrument, testing said electrical component electrically or mechanically, and disconnecting said leads from said testing instrument; and
   (d) pivoting said flapper to move said shorting conductor into contact with said leads.

20. A method in accordance with claim 19 wherein said magazine comprises two or more component holders, each of said fixtures being adapted to support one of said electrical devices and having one said shorting conductor mounted on one said flapper biased to maintain said shorting conductor in contact with substantially all of said leads on said electrical device, comprising:
   (a) moving one of said fixtures to a test station;
   (b) pivoting said flapper to move said shorting conductor away from said leads, testing said electrical device and then pivoting said flapper to move said shorting conductor back into contact with said leads.

21. A method in accordance with claim 20 further comprising moving said fixture away from said test station with said shorting conductor in contact with said leads.

* * * * *